(12) United States Patent
Ihara et al.

(10) Patent No.: US 6,300,284 B1
(45) Date of Patent: Oct. 9, 2001

(54) COPPER-BASED HIGH-TEMPERATURE SUPERCONDUCTING MATERIAL

(75) Inventors: Hideo Ihara; Yoshiyasu Sekita, both of Tsukuba (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/394,089

(22) Filed: Sep. 13, 1999

(30) Foreign Application Priority Data

Sep. 14, 1998 (JP) .................................................. 10-260184

(51) Int. Cl.[7] ............................. H01B 12/00; H01L 39/12
(52) U.S. Cl. .......................... 505/125; 505/120; 505/121
(58) Field of Search .................................... 505/125, 120, 505/121, 470, 473, 826, 833

(56) References Cited

U.S. PATENT DOCUMENTS 5,906,965 * 5/1999 Rao ....................................... 505/470
5,919,735    7/1999 Ihara et al. ............................ 505/125

FOREIGN PATENT DOCUMENTS 7-118014    5/1995    (JP) .

OTHER PUBLICATIONS

Ihara et al. "$Ca_{1-x}Tl_xBa_2$ $Ca_3$ $Ca_4O_{12-y}(Cu_{1-x}Tl_x-1234)$ Superconductor with Tc2126K" International Conf. on Materials & Mech. of Supercon. High Temp Superconductors, Oct. 1997.*

Ihara et al "New High–Tc Superconductor $Ag_{1-x}Cu_xBa_2$ $Ca_{n-1}Cu_nO_{2n+3-\delta}$·JJAP vol. 33 (1994) pp. L300–L303, Part 2, No. 3A, Mar. 1994.*

H. Yamauchi, et al., International Symposium of Processing & Critical Current of High Temperature Superconductors, Symposium Handbook, Held at Charles Sturt University, pp. 21, "Realization of Strongly Over–Doped States in M–1223 [M=Hg (Cu,C)] Superconducting Cuprates", Feb. 2–4, 1998 Abstract.

H. Yamauchi, et al., Institute of Physics Publishing, Superconductor Science and Technology, vol. 11, No. 10, pp. 1006–1010, "Strongly Overdoped States and Irreversibility–Field Characteristics of the Hg–1223 and Cu–1223:P Superconducting Cuprates", Oct. 1998.

T. Ito, et al., Physica C, vol. 308, No. 1&2, pp. 9–15, "Optimization of the Synthesis and Tuning the Oxygen Content of the $CuBa_2Ca_2Cu_3O_{8+\delta}$ (Cu–1223:P) Superconductor", Nov. 1, 1998.

H. Ihara, et al., Physica C, vol. 282–287, part IV, pp. 1973–1974, "How to Make Superconducting–Anisotropy Least in High–Tc Cuprate Superconductors", Aug. 1997.

* cited by examiner

Primary Examiner—Mark Kopec
(74) Attorney, Agent, or Firm—Oblon, Spivak, McClelland, Maier & Neustadt, P.C.

(57) ABSTRACT

A copper-based high-temperature superconducting material includes a carrier supply layer overdoped with carriers; and a superconducting layer comprised of at least three $CuO_2$ layers that are selectively doped with the carriers; whereby a high superconducting transition temperature (Tc) is maintained to be not less than 116 K, critical current density (Jc) is improved to be $5 \times 10^6$ A/cm$^2$ (77 K, 0 T), and irreversible field (Hirr) is improved to be not less than 7 T.

8 Claims, 6 Drawing Sheets

COPPER-BASED HIGH-TEMPERATURE SUPERCONDUCTING MATERIAL

BACKGROUND OF THE INVENTION

1. Field of the Invention

This invention relates to a copper-based high-temperature superconducting material in which the critical current density (Jc) and irreversible field (Hirr) are improved without a major decrease in the high superconducting transition temperature (Tc).

2. Description of the Prior Art

In conventional superconductors having a layered structure such as, for example, Y, Bi, Tl, and Hg based copper-oxide superconductors, as shown in FIG. 2, because overdoping was used to produce a major decrease in the Tc, even if the superconducting anisotropy γ γ being the coherence length ratio, defined as $\xi ab/\xi c$) was decreased, in overall terms there was no improvement in the superconducting characteristics. As a result, at 77 K, it has not been possible to achieve a high Jc and a high Hirr under a high magnetic field condition, which made it difficult to practically apply the superconducting material as wire, in bulk form or as a device material.

With previous high-temperature superconductors having a layered structure, it was difficult to adequately increase the carrier concentration and maintain a high Tc in the overdoped region with the somewhat increased carrier concentration, particularly impossible to achieve a high Jc and a high Hirr under a high magnetic field condition, posing problems with respect to the practical use of the superconducting material as wire, in bulk form or as a device material.

Thus, an object of the present invention is to provide an overdoped high-temperature superconducting material having a high superconducting transition temperature Tc, a high critical current density Jc and a high irreversible field Hirr.

SUMMARY OF THE INVENTION

In order to resolve the above problems, the copper oxide based superconducting material according to the present invention incorporates sufficient oxygen in the carrier supply layer or incorporates cations able to supply holes to thereby effect overdoping of carriers. And, the electron structure (band structure) is utilized for selective doping to overdope part of the $CuO_2$ plane and maintain the remaining $CuO_2$ plane in an optimally doped condition, whereby in overall terms a high superconducting transition temperature Tc is maintained at or over 116 K. The critical current density Jc and irreversible field Hirr can be enhanced to not less than $5\times10^6$ A/cm$^2$ and to not less than 7 T, respectively, by increasing this carrier concentration.

Further features of the invention, its nature and various advantages will be more apparent from the accompanying drawings and following detailed description of the invention.

DESCRIPTION OF THE PREFERRED EMBODIMENTS

Figure 1:
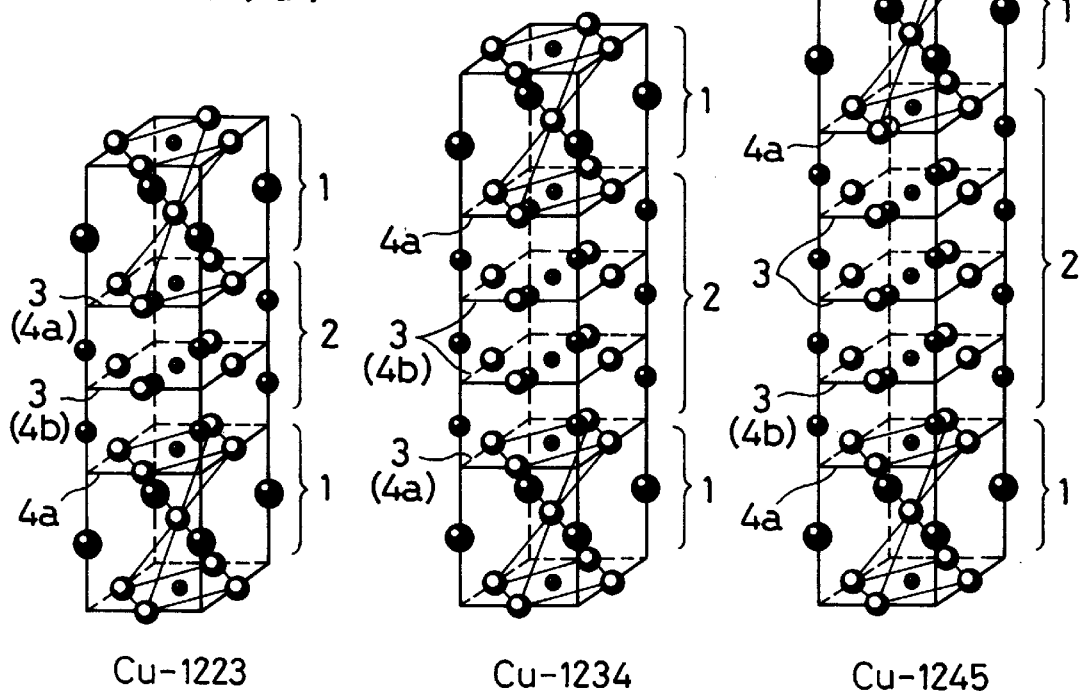
FIG. 1(a), FIG. 1(b) and FIG. 1(c) show models of the crystal structure of a $CuBaCa^*_{-1}Cu_nO_{2n+4-w}$ based material having three, four and five superconducting layers, respectively.

FIG. 1 shows a model of a typical crystal structure of the copper-based high-temperature superconducting material of the present invention. This is comprised of a $CuBa_2O_{4-w}$ carrier supply layer (charge reservoir layer) 1 and a $Ca_{n-1}Cu_nO_{3n}$ superconducting layer 2. The superconducting layer 2 is comprised of three $CuO_2$ layers 3 in the case of the superconducting material of FIG. 1(a), four $CuO_2$ layers 3 in the case of the superconducting material of FIG. 1(b) and five $CuO_2$ layers 3 in the case of the superconducting material of FIG. 1(c). There are vacancies in the oxygen sites of the carrier supply layer 1; the concentration of such vacancies is denoted by w. Ca is sandwiched between superconducting $CuO_2$ layers to maintain the carrier balance. Holes can be increased by increasing the oxygen concentration of the carrier supply layer 1 (reducing the oxygen vacancy concentration w). Superconducting layer 2 is comprised of $CuO_2$ planes 4a each having a pyramidal base, comprised of $CuO_5$ clusters, and $CuO_2$ plane 4b having a square base, comprised of $CuO_4$ clusters, sandwiched between pyramidal bases. The $CuO_2$ planes 4a and 4b have different potential levels (band energy levels), so the hole capacity also differs. This is the principle of selective doping. As a copper-based high-temperature superconducting material that can be selectively overdoped, there can be used a high-performance high-temperature superconducting material having a high superconducting transition temperature of 90 K or above wherein overdoping can be used to increase the carrier concentration to thereby reduce the superconducting anisotropy and achieve a high critical current density [Jc>5×10$^6$ A/cm$^2$, (77 k, 0 T)], a high irreversible field (Hirr>7 T) and a long c-axis coherence length ($\xi c > 6$ Å).

Thus, the copper oxide based superconducting material according to the present invention incorporates sufficient oxygen in the carrier supply layer 1 or incorporates cations able to supply holes to thereby effect overdoping of carriers, and the electron structure (band structure) is utilized for selective doping purposes for overdosing part of the $CuO_2$ plane while maintaining the remaining $CuO_2$ plane in an optimally doped condition, whereby in overall terms a high superconducting transition temperature Tc is maintained. As described above, the increase in the carrier concentration makes it possible to achieve a major improvement in the critical current density Jc and the irreversible field Hirr.

In the case of the copper-based high-temperature superconducting material having the chemical formula (1) $[Cu_{1-x}M_x(Ba_{1-y}Sr_y)_2 (Ca_{1-z}L_z)_{n-1}Cu_nO_{2n+4-w}]$, the average valency of the Cu can be expressed as $Z=2+(4-2w)/(n+1)$ $<2+4/(n+1)$, in which n is 3 to 16 and Z is not less than 2.25 and not more than 3. This ensures the supply of carriers is enough to attain an overdoped state of $Z \leqq 2.25$ and a hole concentration of not less than $0.25/CuO_2$ by decreasing the oxygen vacancy concentration w (when $Z=2.25$, an optimum doping amount in the case of $Z=2.25$ is generally one that produces a hole concentration per $CuO_2$ of 0.25. A region in which the hole concentration exceeds $0.25/CuO_2$ is referred to as an overdoped region).

In the above formula, M is one or more members selected from the group consisting of Tl, Hg, Bi, Pb, In, Ga, Al, B, C, Si, Sn, Ag, Au, S, N, P, Mo, Re, Os, Cr, Ti, V, Fe, lanthanide series elements and alkaline metals, and L is one or more members selected from the group consisting of Mg, Y and lanthanide series elements.

Figure 4:
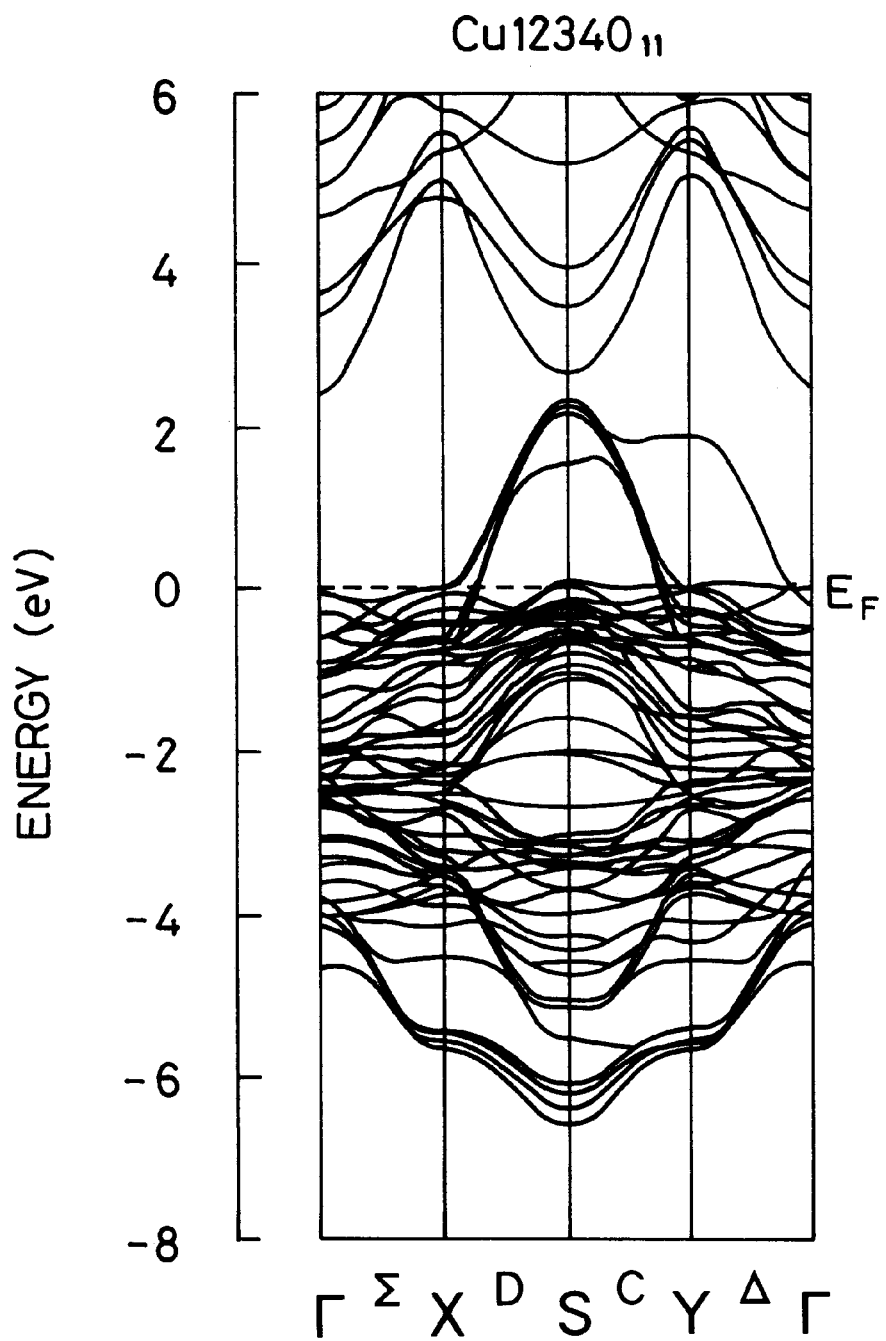
FIG. 4 shows the band structure of $CuBaCa_3Cu_4O_{11}$ material (Cu-1223).

The selective overdoping described above is effected using the potential level differentials between the multiple types of $CuO_2$ layers constituting the high-temperature superconducting material (herein meaning the two types of $CuO_2$ plane) and the band energy level differentials between the $CuO_2$ layers (the vertical relationship of the bands intersecting line $E_F$ (Fermi level) in FIG. 4).

The $CuO_2$ plane of the pyramidal $CuO_5$ clusters can thus be overdoped, raising the carrier concentration and improving the critical current density Jc and the irreversible field Hirr. At the same time, the optimal or near-optimal doped state of the $CuO_2$ plane of the planar $CuO_4$ clusters can be maintained, helping to maintain the superconducting transition temperature Tc. Thus separately selectively forming and utilizing the overdoped and optimally doped $CuO_2$ planes makes it possible to achieve, simultaneously, the high Tc, high Jc and high Hirr that form the three major characteristics of a high-performance superconducting material.

Thus, the selective overdoping of the present invention makes it possible to increase the carrier concentration of a high-temperature superconducting material having a layered structure, reduce the superconducting anisotropy γ while maintaining a high superconducting transition temperature Tc and achieve a high Jc and Hirr. Moreover, the superconducting material represented by the formula (1) $Cu_{1-x}M_x (Ba_{1-y}Sr_y)_2(Ca_{1-z}L_z)_{n-1}Cu_nO_{2n+4-w}$ is a material having a crystal and electron structure that, through the use of selective overdoping, allows the Jc and Hirr to be improved while at the same time maintaining a high Tc.

Moreover, with a $Cu_{1-x}Tl_x$ superconductor a thin film of the material can be formed by amorphous phase epitaxy (APE), the oxygen concentration can be increased and, based on the crystal and electron structure thereof, selective overdoping can be used to realize a high-performance superconducting material.

Furthermore, the selective overdoping of the present invention can partially covert the superconducting wave function from the symmetrical d wave components to symmetrical s wave components to obtain a d+is wave, thereby realizing a high-performance superconducting material.

How the high superconducting transition temperature of the high-temperature superconducting material of the present invention is achieved and maintained, and the method of producing the material, will now be described in specific detail.

Figure 2:
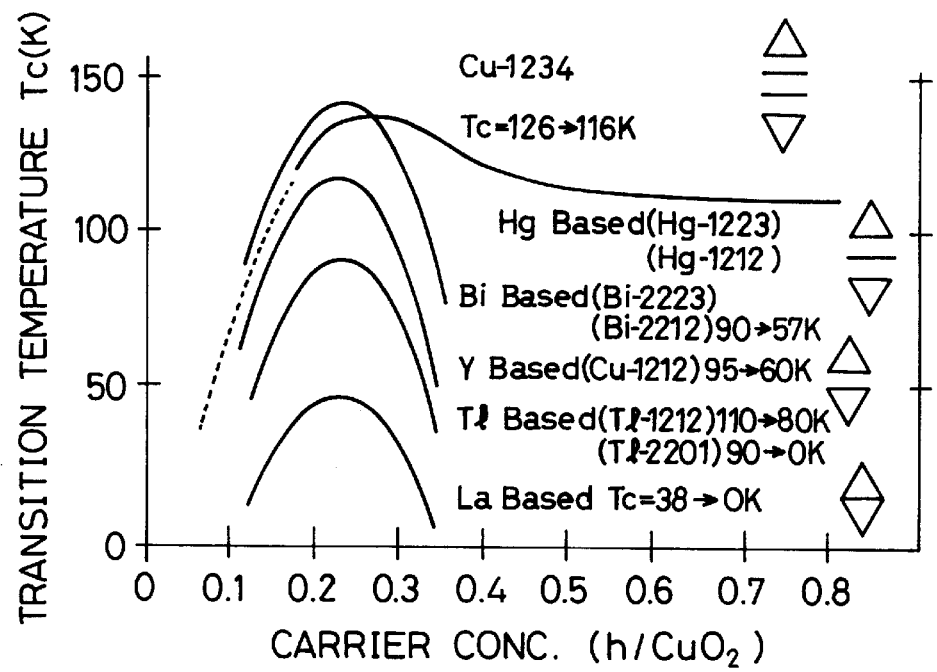
FIG. 2 shows the relationship between the superconducting transition temperature Tc and the carrier concentration of a high-temperature superconducting material.

(1) Maintaining a high Tc with $Cu_{1-x}M_xBa_2Ca_3Cu_4O_{12-y}$ ($Cu_{1-x}M_x1234$) in an overdoped state:

At a Tc of 126 to 116 K the superconducting anisotropy $(\gamma=\xi ab/\xi c)$ of $Cu_{1-x}M_xBa_2Ca_3Cu_4O_{12-y}(Cu_{1-x}M_x1234)$ can be lowered to 1.6 to 1.4. In an overdoped region this $Cu_{1-x}M_x1234$ material can maintain a high Tc, which means it can be expected to have a high Jc under a high magnetic field, making it a practical, highly important material. Since the $Cu_{1-x}M_x1234$ has three $CuO_2$ bands with different energy levels, by using selective doping, even in an overdoped region, the central $CuO_2$ plane can be maintained in an optimally doped state. In such a case it is possible selectively to effect a correspondence between the k space and the real space of the bands and $CuO_2$ planes, and by selectively overdoping just the pyramidal base of the $CuO_5$, it is possible to maintain the $CuO_4$ plane in the optimum doped state while, as shown in FIG. 2, maintaining a high Tc even in the overdoped region.

Figure 3:
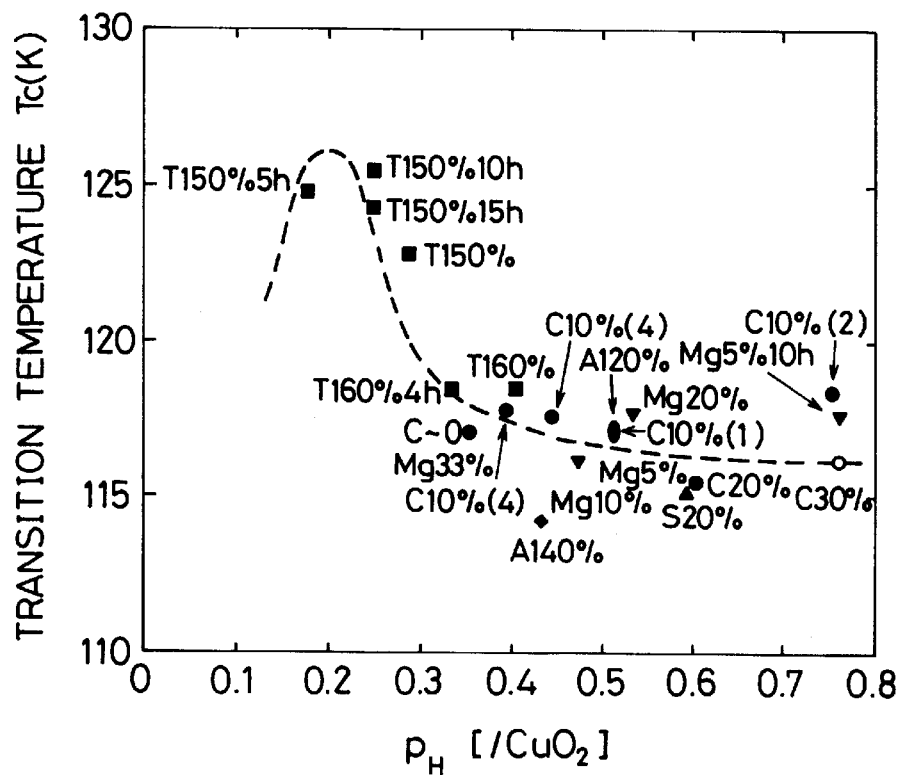
FIG. 3 shows the relationship between the superconducting transition temperature and the carrier concentration of a $Cu_{1-x}M_x$-1234 based material.

(2) Realizing a high Tc in a high-carrier-concentration $Cu_{1-x}M_x$-1234:

Specimens of $Cu_{1-x}M_xBa_2Ca_3Cu_4O_{12-x}(Cu_{1-x}M_x-1234)$ carrier supply layers were prepared in which in the Cu sites Tl, C, Al, Mg and S were substituted for M and the Hall effect was measured to measure the carrier concentration. FIG. 3 shows the relationship between carrier concentration (hole concentration) and Tc. With no oxidizing agent being used during fabrication, the amount of oxygen in the Tl-50% specimen was reduced and a high Tc of 126 K was attained. The specimen had a low carrier concentration not exceeding $0.2/CuO_2$. This being the relationship, the carrier concentration was $0.2/CuO_2$ at 126 K, the highest Tc of the $Cu_{1-x}M_x$-1234. When the oxygen amount is increased, a high Tc (119 to 116 K) is maintained despite the large increase in the carrier concentration. This was common to all specimens into which a large amount of oxygen was introduced and which exhibited a high carrier concentration (up to $0.60/CuO_2$).

(3) Calculating $CuBa_2Ca_3Cu_4O_{12-y}$(Cu-1234) bands:

Cu-1234 high-temperature superconductors have four $CuO_2$ layer planes. Because they also contain copper atoms in the carrier supply layers, electrical conduction was thought to be possible along the c axis via the d orbit of the copper. Moreover, since CuO chains and $CuO_2$ planes can also be formed in the carrier supply layers by increasing the oxygen concentration in the carrier supply layers (y→0), it was thought that in such a case the newly formed CuO chains and $CuO_2$ planes should increase electrical conduction along the c axis.

FIG. 4 shows the band structure of $CuBa_2Ca_3Cu_4O_{11}$. The five bands formed by the four $CuO_2$ planes and the CuO chains in the carrier supply layer intersect the Fermi level. From the bottom, the hole counts of the bands corresponding to the four $CuO_2$ planes are 0.50, 0.55, 0.63 and 0.84 per band. These are used to effect the two selective dopings of optimum doping and overdoping for the two types of $CuO_2$ plane ($O_4$ and $O_5$) and estimate the optimum doping concentration and overdoping concentration.

(4) Producing superconducting films of $Cu_{1-x}Tl_x$-1223 $[Cu_{1-x}Tl_x(Ba,Sr)_2Ca_2Cu_3O_y]$, and the superconductivity characteristics of the films:

The amorphous films of $Cu_{1-x}Tl_x$-1223$[Cu_{1-x}Tl_x(Ba, Sr)_2Ca_2Cu_3O_y]$ was treated with Tl having reaction-promoting and structure-stabilizing effects, and APE was used to form superconducting films of $Cu_{1-x}Tl_x$-1223 $[Cu_{1-x}Tl_x(Ba, Sr)_2Ca_2Cu_3O_y]$ using a composition in which x=0.4 to 0.6, to obtain a Jc of $2\times10^7$ A/cm$^2$ (77 K, 0 T).

Figure 5:
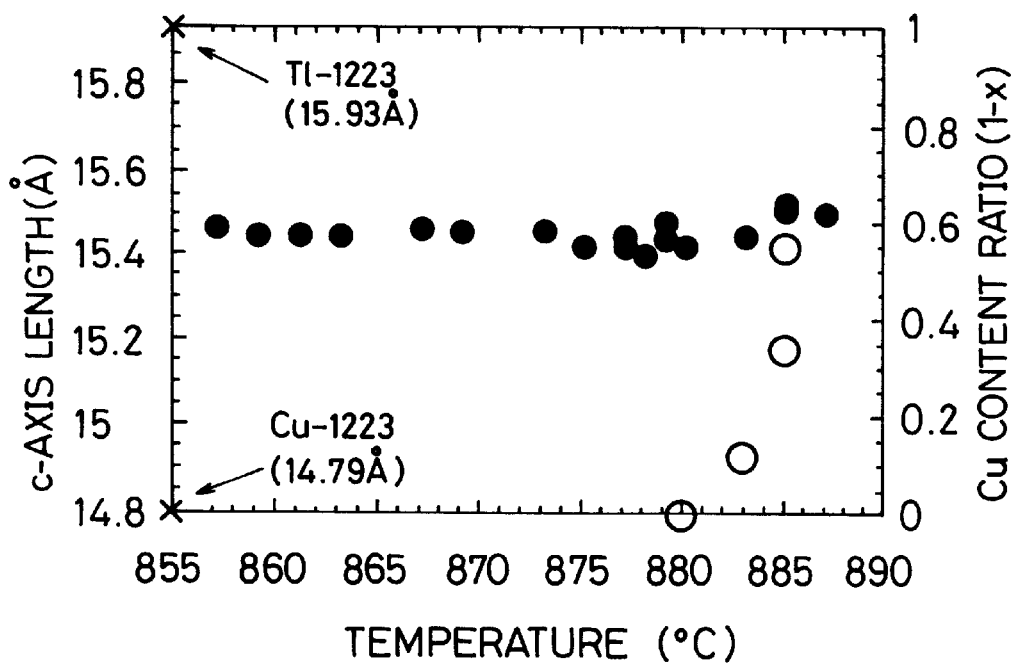
FIG. 5 shows the Cu content ratio (1−x) and c axis length with respect to the process temperature of $Cu_{1-x}Tl_x$-1223 thin film.
Figure 6:
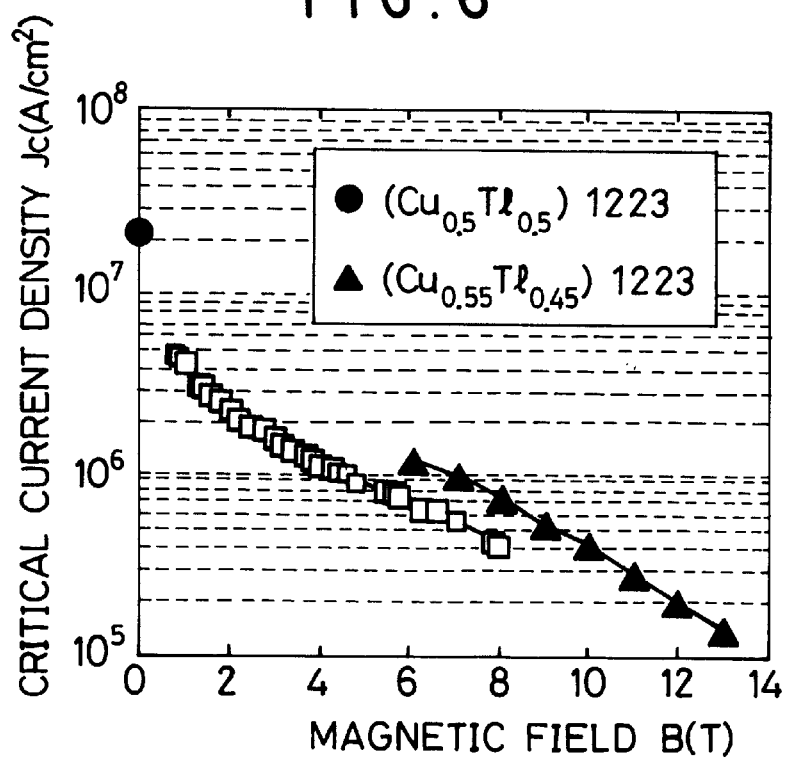
FIG. 6 shows the field dependency of the critical current density Jc in a $Cu_{1-x}Tl_x$-1223 thin film.

RF magnetron sputtering was used to deposit an amorphous film on an $SrTiO_3$ substrate, and this was sealed inside an Ag or Au capsule together with pellets of $(Cu_{1-x}Tl_x)(Sr,Ba)_2Ca_2Cu_3O_y$ ($0.25 \leq x \leq 0.5$) in order to treat it with Tl having reaction-promoting and structure-stabilizing effects, and heat-treated to form $(Cu_{1-x}Tl_x)$-1223 thin film. The heat treatment conditions used were 860 to 890° C. for 30 to 90 minutes, resulting in the formation of a substantially single phase film. A strong (001) peak was observed in the x-ray diffraction pattern, revealing a strong c axis orientation. As shown in FIG. 5, the lattice constant on the c axis was 15.47 Å, which is between the 14.79 Å of the copper and the 15.93 Å of the thallium. In FIG. 5, solid circles (●) denote the c-axis length and blank circles (○) denote the Cu content. Using pole figure measurements, a strong a, b axial orientation in the ab plane was confirmed ($\Delta\phi=0.7°$). A Tc of 105 K and a Jc of $2\times10^7$ A/cm$^2$ (77 K, 0 T) was obtained with a specimen of $(Cu_{0.5}Tl_{0.5})$-1223 formed using a heat treatment temperature of 885° C. and a heat treatment time of 42 minutes. As shown in FIG. 6, with a $(Cu_{0.55}Tl_{0.45})$-1223 specimen, a Jc of $4\times10^5$ A/cm$^2$ was obtained in a magnetic field at a Tc of 112 K (77 K, 10 T). These are high values, being approximately twice the highest Jc (shown by blank squares in FIG. 6) obtained with previous YBCO films.

Figure 7A:
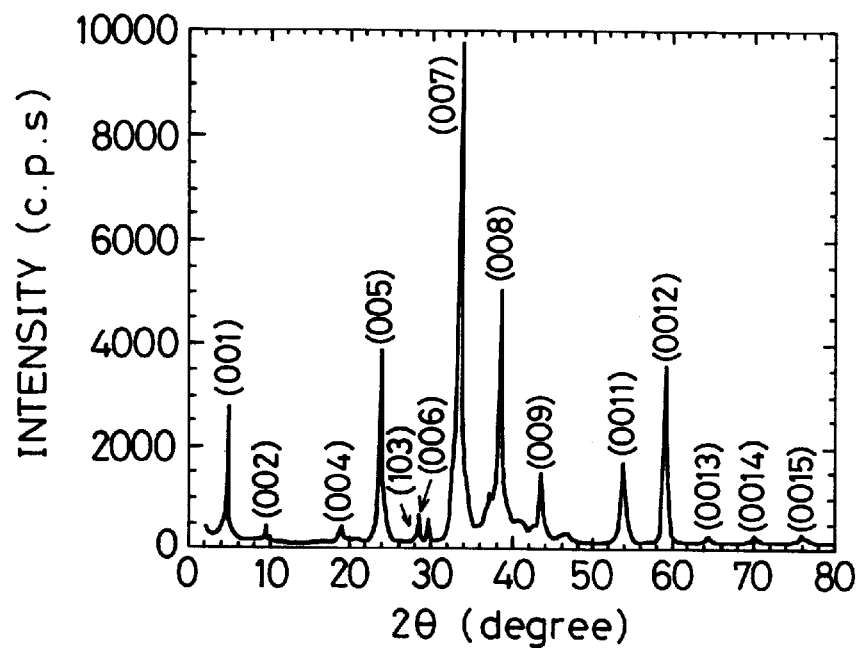
FIG. 7 (a) and FIG. 7(b) are x-ray diffraction diagrams showing the orientation characteristics of $Cu_{1-x}Tl_x$-1234 thin film, with FIG. 7 (a) showing the c axis orientation and FIG. 7 (b) showing the a, b axis orientation.
Figure 7B:
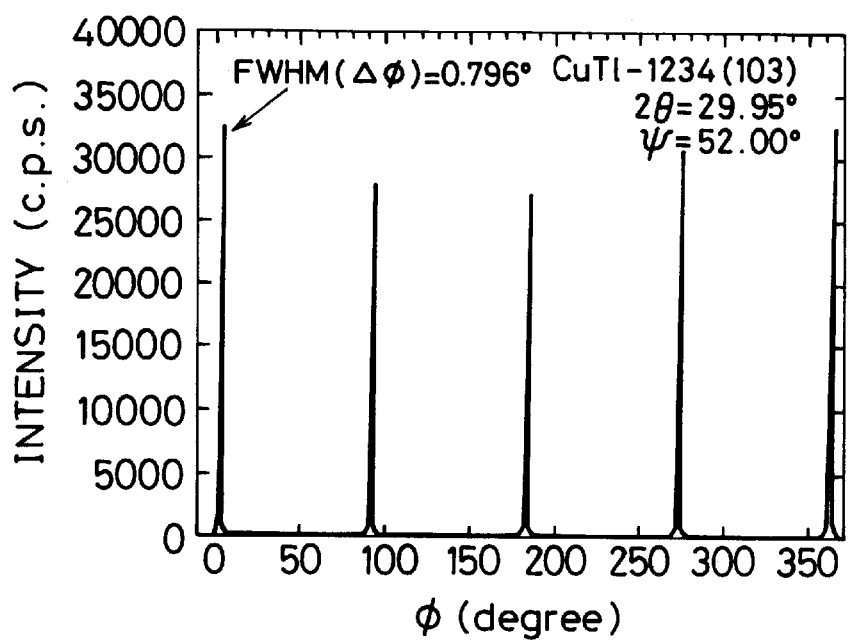
Figure 8:
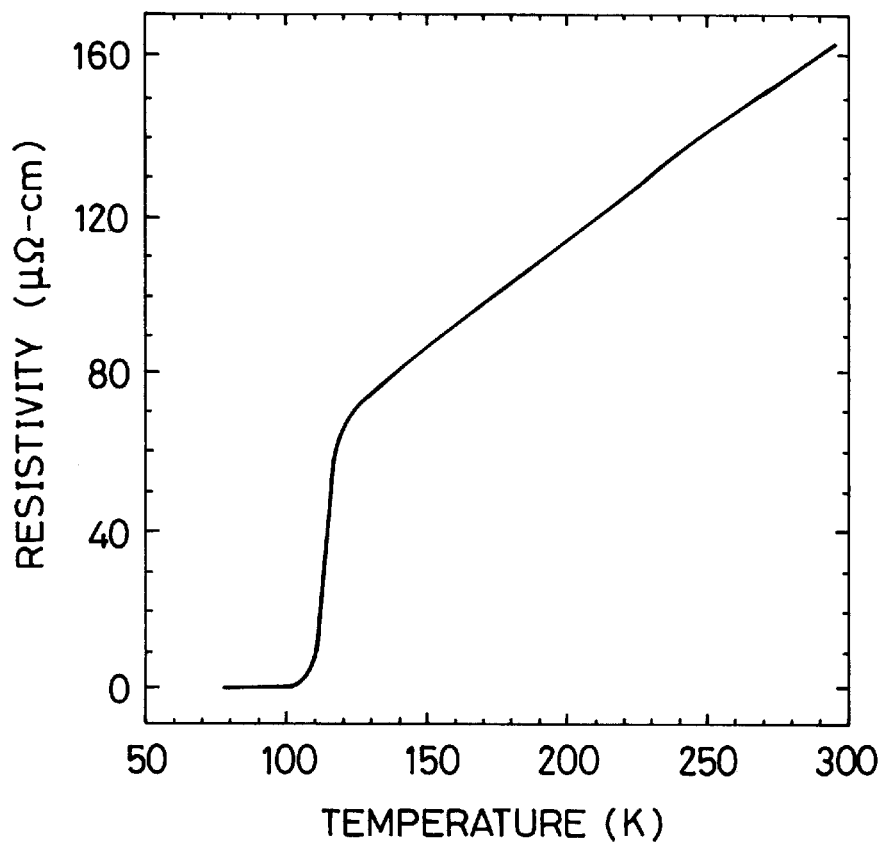
FIG. 8 shows the relationship between the electrical resistivity and the temperature of $Cu_{1-x}Tl_x$-1234 thin film.

(5) Producing thin films of $Cu_{1-x}Tl_x$-1234 $(Cu_{1-x}Tl_xBa_2Ca_3Cu_4O_y)$:

Thin films of $Cu_{1-x}Tl_x$-1234 were formed by the APE method. Amorphous film of $CuBa_2Ca_3Cu_4O_y$ formed on an $SrTiO_3$ substrate by sputtering was enclosed in a gold capsule together with pellets of $Cu_{1-x}Tl_x$-1234 (x=0.25 to 0.5) in order to treat it with Tl having reaction-promoting and structure-stabilizing effects, and heated at 900° C. for one hour. As revealed by the x-ray diffraction diagram of the thin film shown in FIG. 7(a), the lattice constant was 18.74 Å, which is between the 17.99 Å of Cu-1234 and the 19.11 Å of Tl-1234. A strong ab plane orientation was exhibited, with the peak width at half height being AO =0.8° measured using an x-ray pole figure (FIG. 7(b)). EDX analysis showed the composition to be $Cu_{0.3}Tl_{0.7}Ba_2Ca_3Cu_4$. With respect to FIG. 8, the superconducting transition temperature Tc indicating the relationship between resistivity and temperature was 113 K. The Jc was $1\times10^6$ A/cm$^2$ (77 K, 0 T). It should be possible to achieve a further improvement in both Tc and Jc.

Figure 9:
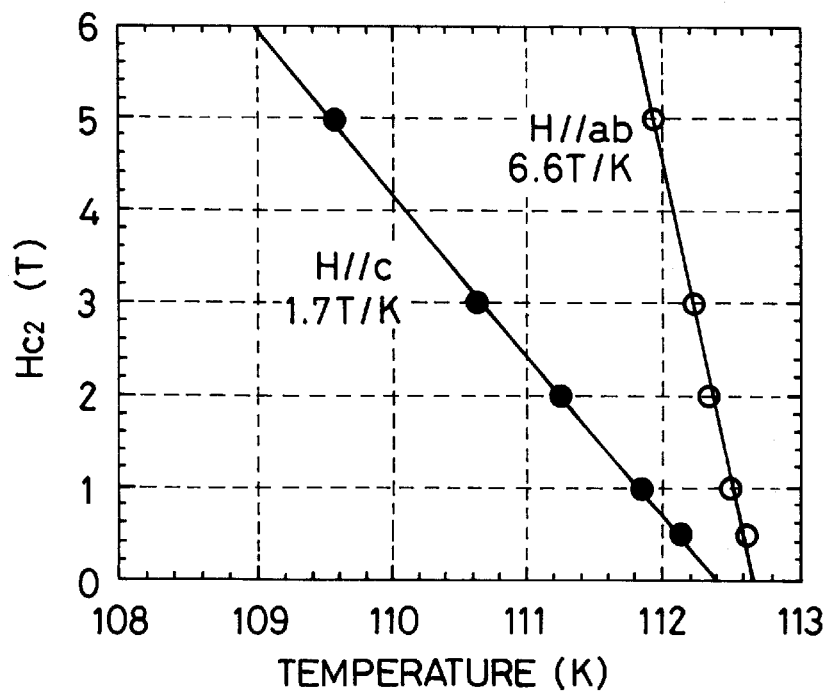
FIG. 9 shows the temperature dependency of the irreversible field $H_{c2}$ of a $Cu_{1-x}Tl_x$-1223 sintered body.

(6) High-pressure synthesis and superconducting characteristics of $Cu_{1-x}Tl_x$-1223:

A cubic anvil type high-pressure apparatus was used to fabricate specimens having the composition $(Cu_{1-x}Tl_x)Ba_2Ca_2Cu_3O_y$, using as process conditions a pressure of 5 GPa at a temperature of 850° C. for two hours. The specimen was oriented in a magnetic field, and the temperature dependency of the magnetization in the c axis direction and that in the ab plane direction were measured. Magnetization measurements were conducted in a magnetic field of 0.5 to 5 T to obtain changes in the superconducting transition temperature relative to the magnetic field. The temperature dependency $H_{c2}$ is shown in FIG. 9. Based on this, it could be estimated that at 0 K, the upper critical field would be $(H_{c2})(0)=132$ T, $(H_{c2})_{ab}(0)=513$ T, and the coherence length $\xi_{ab}=16$ Å, $\xi_c=4$ Å. From this ratio of the $H_{c2}$ along the ab plane to that along the c axis, it was found that the superconducting anisotropy γ was 4. At a Tc of 113 K, the carrier concentration of this specimen was $0.5/CuO_2$.

In accordance with the present invention, it is possible to maintain a high Tc in overdoping regions that was not achievable with previous Cu-1234 high-temperature superconductors.

Previously, it was gradually becoming the accepted wisdom that overdoping resulted in a decreased Tc. As such, the attainment of a high-temperature superconductor in which overdoping is used but which nevertheless exhibits a hitherto unattainably high Tc, Jc and Hirr will overturn this conventional wisdom and have a major academic impact. At the same time it also provides important pointers to the elucidation of the high-temperature superconductivity mechanism. By enabling the development of a high-performance high-temperature superconducting material, it will also have a major engineering and industrial impact as a prospective wire, and bulk material and as a device material.

What is claimed is:

1. A copper-based high-temperature superconducting material comprising:

a carrier supply layer overdoped with carriers; and a superconducting layer comprised of at least three $CuO_2$ planes which consist of at least two overdoped outer $CuO_2$ planes and at least one optimum-doped inner $CuO_2$ plane and that are selectively doped with said carriers, wherein said superconducting material having a composition formula:

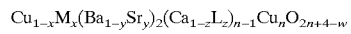

$$Cu_{1-x}M_x(Ba_{1-y}Sr_y)_2(Ca_{1-z}L_z)_{n-1}Cu_nO_{2n+4-w}$$

in which M is one or more members selected from a group consisting of Tl, Hg, Bi, Pb, In, Ga, Al, B, C, Si, Sn, Ag, Au, S, N, P, Mo, Re, Os, Cr, Ti, V, Fe, lanthanide series elements and alkaline metals;

L is one or more members selected from a group consisting of Mg, Y and lanthanide series elements;

$0 \leq x \leq 0.9$;

$0 \leq y \leq 1$;

$0 \leq z \leq 1$;

$0 \leq w \leq 4$; and $0 \leq n \leq 16$;

whereby a high superconducting transition-temperature (Tc) is maintained to be not less than 116 K, critical current density (Jc) is improved to be $5\times10^6$ A/cm$^2$ (77 K, 0 T), and irreversible field (Hirr) is improved to be not less than 7 T, wherein said superconducting material has a carrier concentration of at least about $0.5/CuO_2$.

2. The superconducting material according to claim 1 wherein said $CuO_2$ layers are selectively doped with said carriers using differentials in potential levels or band energy levels between the $CuO_2$ layers.

3. The superconducting material according to claim 2, wherein the selective doping partially converts a superconducting wave function from symmetrical d wave components to symmetrical s wave components to obtain a d+is wave.

4. The superconducting material according to claim 1, wherein it is produced by amorphous phase epitaxy.

5. The superconducting material according to claim 4, wherein it is comprised of $Cu_{1-x}Tl_x$-1223 (n=3), $Cu_{1-x}Tl_x$-1234 (n=4), $Cu_{1-x}Tl_x$-1245 (n=5), $Cu_{1-x}Tl_x$-1256 (n=6) or $Cu_{1-x}Tl_x$-1267 (n=7).

6. The superconducting material according to claim 1, wherein it is produced using reaction-promoting and structure-stabilizing effects of Tl.

7. The superconducting material according to claim 6, wherein it is comprised of $Cu_{1-x}Tl_x$-1223 (n=3), $Cu_{1-x}Tl_x$-1234 (n=4), $Cu_{1-x}Tl_x$-1245 (n=5), $Cu_{1-x}Tl_x$-1256 (n=6) or $Cu_{1-x}Tl_x$-1267 (n=7).

8. The superconducting material according to claim 1, wherein it is comprised of $Cu_{1-x}Tl_x$-1223 (n=3), $Cu_{1-x}Tl_x$-1234 (n=4), $Cu_{1-x}Tl_x$-1245 (n=5), $Cu_{1-x}Tl_x$-1256 (n=6) or $Cu_{1-x}Tl_x$-1267 (n=7).

* * * * *